(12) United States Patent
Gose et al.

(10) Patent No.: US 12,225,696 B2
(45) Date of Patent: Feb. 11, 2025

(54) SYSTEMS AND METHODS FOR LOW INDUCTANCE PHASE SWITCH FOR INVERTER FOR ELECTRIC VEHICLE

(71) Applicant: BorgWarner US Technologies LLC, Wilmington, DE (US)

(72) Inventors: Mark Wendell Gose, Kokomo, IN (US); Seyed R. Zarabadi, Kokomo, IN (US)

(73) Assignee: BorgWarner US Technologies LLC, Wilmington, DE (US)

( * ) Notice: Subject to any disclaimer, the term of this patent is extended or adjusted under 35 U.S.C. 154(b) by 202 days.

(21) Appl. No.: 18/166,043

(22) Filed: Feb. 8, 2023

(65) Prior Publication Data

US 2024/0106372 A1 Mar. 28, 2024

Related U.S. Application Data

(60) Provisional application No. 63/378,601, filed on Oct. 6, 2022, provisional application No. 63/377,486, filed
(Continued)

(51) Int. Cl.
*H02P 25/22* (2006.01)
*B60L 3/00* (2019.01)
(Continued)

(52) U.S. Cl.
CPC .......... *H05K 7/20927* (2013.01); *B60L 3/003* (2013.01); *B60L 15/007* (2013.01);
(Continued)

(58) Field of Classification Search
CPC ...... H02P 25/22; H02P 27/08; B60L 2210/40; B60L 50/51; B60L 50/60; H05K 7/209; H02J 7/24; H02K 11/33
See application file for complete search history.

(56) References Cited

U.S. PATENT DOCUMENTS

| | | |
|---|---|---|
| 4,054,828 A | 10/1977 | Conzelmann et al. |
| 4,128,801 A | 12/1978 | Gansert et al. |

(Continued)

FOREIGN PATENT DOCUMENTS

| | | |
|---|---|---|
| EP | 2482438 A2 | 8/2012 |
| JP | 2001309690 A | 11/2001 |

(Continued)

OTHER PUBLICATIONS

Balogh, L., "Fundamentals of MOSFET and IGBT Gate Driver Circuits," Texas Instruments Application Report, SLUA618—Mar. 2017, Retrieved from internet URL: https://ghioni.faculty.polimi.it/pel/readmat/gate-drive.pdf, 65 pages.
(Continued)

*Primary Examiner* — Cortez M Cook
(74) *Attorney, Agent, or Firm* — Joshua M. Haines; Bookoff McAndrews, PLLC

(57) ABSTRACT

A system includes: an inverter configured to convert DC power from a battery to AC power to drive a motor, wherein the inverter includes: a power module including: a first phase switch including one or more first phase power switches on a first side of a substrate; and a second phase switch including one or more second phase power switches on a second side of the substrate opposite to the first side.

17 Claims, 10 Drawing Sheets

Related U.S. Application Data on Sep. 28, 2022, provisional application No. 63/377,501, filed on Sep. 28, 2022, provisional application No. 63/377,512, filed on Sep. 28, 2022.

(51) Int. Cl.

| | | |
|---|---|---|
| *B60L 15/00* | (2006.01) | |
| *B60L 15/08* | (2006.01) | |
| *B60L 50/40* | (2019.01) | |
| *B60L 50/51* | (2019.01) | |
| *B60L 50/60* | (2019.01) | |
| *B60L 50/64* | (2019.01) | |
| *B60L 53/20* | (2019.01) | |
| *B60L 53/22* | (2019.01) | |
| *B60L 53/62* | (2019.01) | |
| *B60R 16/02* | (2006.01) | |
| *G01R 15/20* | (2006.01) | |
| *G06F 1/08* | (2006.01) | |
| *G06F 13/40* | (2006.01) | |
| *H01L 21/48* | (2006.01) | |
| *H01L 23/00* | (2006.01) | |
| *H01L 23/15* | (2006.01) | |
| *H01L 23/367* | (2006.01) | |
| *H01L 23/373* | (2006.01) | |
| *H01L 23/40* | (2006.01) | |
| *H01L 23/467* | (2006.01) | |
| *H01L 23/473* | (2006.01) | |
| *H01L 23/495* | (2006.01) | |
| *H01L 23/538* | (2006.01) | |
| *H01L 25/00* | (2006.01) | |
| *H01L 25/07* | (2006.01) | |
| *H01L 29/66* | (2006.01) | |
| *H02J 7/00* | (2006.01) | |
| *H02M 1/00* | (2006.01) | |
| *H02M 1/08* | (2006.01) | |
| *H02M 1/084* | (2006.01) | |
| *H02M 1/088* | (2006.01) | |
| *H02M 1/12* | (2006.01) | |
| *H02M 1/32* | (2007.01) | |
| *H02M 1/42* | (2007.01) | |
| *H02M 1/44* | (2007.01) | |
| *H02M 3/335* | (2006.01) | |
| *H02M 7/00* | (2006.01) | |
| *H02M 7/537* | (2006.01) | |
| *H02M 7/5387* | (2007.01) | |
| *H02M 7/5395* | (2006.01) | |
| *H02P 27/06* | (2006.01) | |
| *H02P 27/08* | (2006.01) | |
| *H02P 29/024* | (2016.01) | |
| *H02P 29/68* | (2016.01) | |
| *H05K 1/14* | (2006.01) | |
| *H05K 1/18* | (2006.01) | |
| *H05K 5/02* | (2006.01) | |
| *H05K 7/20* | (2006.01) | |
| *B60L 15/20* | (2006.01) | |
| *H03K 19/20* | (2006.01) | |

(52) U.S. Cl.
CPC .............. *B60L 15/08* (2013.01); *B60L 50/40* (2019.02); *B60L 50/51* (2019.02); *B60L 50/60* (2019.02); *B60L 50/64* (2019.02); *B60L 53/20* (2019.02); *B60L 53/22* (2019.02); *B60L 53/62* (2019.02); *B60R 16/02* (2013.01); *G01R 15/20* (2013.01); *G06F 1/08* (2013.01); *G06F 13/4004* (2013.01); *H01L 21/4882* (2013.01); *H01L 23/15* (2013.01); *H01L 23/3672* (2013.01); *H01L 23/3675* (2013.01); *H01L 23/3735* (2013.01); *H01L 23/4006* (2013.01); *H01L 23/467* (2013.01); *H01L 23/473* (2013.01); *H01L 23/49562* (2013.01); *H01L 23/5383* (2013.01); *H01L 24/32* (2013.01); *H01L 24/33* (2013.01); *H01L 25/072* (2013.01); *H01L 25/50* (2013.01); *H01L 29/66553* (2013.01); *H02J 7/0063* (2013.01); *H02M 1/0009* (2021.05); *H02M 1/0054* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/327* (2021.05); *H02M 1/4258* (2013.01); *H02M 1/44* (2013.01); *H02M 3/33523* (2013.01); *H02M 7/003* (2013.01); *H02M 7/537* (2013.01); *H02M 7/5387* (2013.01); *H02M 7/53871* (2013.01); *H02M 7/53875* (2013.01); *H02M 7/5395* (2013.01); *H02P 27/06* (2013.01); *H02P 27/08* (2013.01); *H02P 27/085* (2013.01); *H02P 29/024* (2013.01); *H02P 29/027* (2013.01); *H02P 29/68* (2016.02); *H05K 1/145* (2013.01); *H05K 1/181* (2013.01); *H05K 1/182* (2013.01); *H05K 5/0247* (2013.01); *H05K 7/20154* (2013.01); *H05K 7/2039* (2013.01); *H05K 7/2049* (2013.01); *H05K 7/20854* (2013.01); *H05K 7/209* (2013.01); *B60L 15/20* (2013.01); *B60L 2210/30* (2013.01); *B60L 2210/40* (2013.01); *B60L 2210/42* (2013.01); *B60L 2210/44* (2013.01); *B60L 2240/36* (2013.01); *G06F 2213/40* (2013.01); *H01L 2023/405* (2013.01); *H01L 2023/4087* (2013.01); *H01L 2224/32225* (2013.01); *H01L 2224/32245* (2013.01); *H01L 2224/33181* (2013.01); *H02J 2207/20* (2020.01); *H02P 2207/05* (2013.01); *H03K 19/20* (2013.01); *H05K 2201/042* (2013.01); *H05K 2201/10166* (2013.01)

(56) References Cited

U.S. PATENT DOCUMENTS

| | | |
|---|---|---|
| 4,564,771 A | 1/1986 | Flohrs |
| 4,618,875 A | 10/1986 | Flohrs |
| 4,716,304 A | 12/1987 | Fiebig et al. |
| 5,068,703 A | 11/1991 | Conzelmann et al. |
| 5,432,371 A | 7/1995 | Denner et al. |
| 5,559,661 A | 9/1996 | Meinders |
| 5,654,863 A | 8/1997 | Davies |
| 5,764,007 A | 6/1998 | Jones |
| 5,841,312 A | 11/1998 | Mindl et al. |
| 6,028,470 A | 2/2000 | Michel et al. |
| 6,163,138 A | 12/2000 | Kohl et al. |
| 6,351,173 B1 | 2/2002 | Ovens et al. |
| 6,426,857 B1 | 7/2002 | Doster et al. |
| 6,597,556 B1 | 7/2003 | Michel et al. |
| 6,812,553 B2 | 11/2004 | Gerbsch et al. |
| 6,943,293 B1 | 9/2005 | Jeter et al. |
| 7,095,098 B2 | 8/2006 | Gerbsch et al. |
| 7,229,855 B2 | 6/2007 | Murphy |
| 7,295,433 B2 | 11/2007 | Taylor et al. |
| 7,459,954 B2 | 12/2008 | Kuehner et al. |
| 7,538,425 B2 | 5/2009 | Myers et al. |
| 7,551,439 B2 | 6/2009 | Peugh et al. |
| 7,616,047 B2 | 11/2009 | Rees et al. |
| 7,724,046 B2 | 5/2010 | Wendt et al. |
| 7,750,720 B2 | 7/2010 | Dittrich |
| 9,088,159 B2 | 7/2015 | Peuser |
| 9,275,915 B2 | 3/2016 | Heinisch et al. |

(56) References Cited

U.S. PATENT DOCUMENTS

| | | |
|---|---|---|
| 9,373,970 B2 | 6/2016 | Feuerstack et al. |
| 9,431,932 B2 | 8/2016 | Schmidt et al. |
| 9,515,584 B2 | 12/2016 | Koller et al. |
| 9,548,675 B2 | 1/2017 | Schoenknecht |
| 9,806,607 B2 | 10/2017 | Ranmuthu et al. |
| 9,843,320 B2 | 12/2017 | Richter et al. |
| 9,871,444 B2 | 1/2018 | Ni et al. |
| 9,882,490 B2 | 1/2018 | Veeramreddi et al. |
| 10,111,285 B2 | 10/2018 | Shi et al. |
| 10,116,300 B2 | 10/2018 | Blasco et al. |
| 10,232,718 B2 | 3/2019 | Trunk et al. |
| 10,270,354 B1 | 4/2019 | Lu et al. |
| 10,291,225 B2 | 5/2019 | Li et al. |
| 10,525,847 B2 | 1/2020 | Strobel et al. |
| 10,797,579 B2 | 10/2020 | Hashim et al. |
| 10,924,001 B2 | 2/2021 | Li et al. |
| 11,082,052 B2 | 8/2021 | Jang et al. |
| 11,108,389 B2 | 8/2021 | Li et al. |
| 11,342,911 B2 | 5/2022 | Lee et al. |
| 11,838,011 B2 | 12/2023 | Li et al. |
| 11,843,320 B2 | 12/2023 | Sivakumar et al. |
| 11,848,426 B2 | 12/2023 | Zhang et al. |
| 11,851,038 B2 | 12/2023 | Solanki et al. |
| 11,855,522 B2 | 12/2023 | Rudolph et al. |
| 11,855,630 B2 | 12/2023 | Dake et al. |
| 11,870,338 B1 | 1/2024 | Narayanasamy |
| 11,872,997 B2 | 1/2024 | Hoos et al. |
| 11,881,859 B2 | 1/2024 | Gupta et al. |
| 11,888,391 B2 | 1/2024 | Balasubramanian et al. |
| 11,888,393 B2 | 1/2024 | Venkateswaran et al. |
| 11,901,803 B2 | 2/2024 | Ruck et al. |
| 11,901,881 B1 | 2/2024 | Narayanasamy |
| 11,909,319 B2 | 2/2024 | Esteghlal et al. |
| 11,916,426 B2 | 2/2024 | Oner et al. |
| 11,923,762 B2 | 3/2024 | Sethumadhavan et al. |
| 11,923,764 B1 | 3/2024 | Zhang |
| 11,923,799 B2 | 3/2024 | Ojha et al. |
| 11,925,119 B2 | 3/2024 | Male et al. |
| 11,927,624 B2 | 3/2024 | Patel et al. |
| 11,938,838 B2 | 3/2024 | Simonis et al. |
| 11,942,927 B2 | 3/2024 | Purcarea et al. |
| 11,942,934 B2 | 3/2024 | Ritter |
| 11,945,331 B2 | 4/2024 | Blemberg et al. |
| 11,945,522 B2 | 4/2024 | Matsumura et al. |
| 11,949,320 B2 | 4/2024 | Jaladanki et al. |
| 11,949,333 B2 | 4/2024 | Pahkala et al. |
| 11,955,896 B2 | 4/2024 | Liu et al. |
| 11,955,953 B2 | 4/2024 | Sinn et al. |
| 11,955,964 B2 | 4/2024 | Agarwal et al. |
| 11,962,234 B2 | 4/2024 | Narayanasamy et al. |
| 11,962,291 B2 | 4/2024 | Oberdieck et al. |
| 11,964,587 B2 | 4/2024 | Yukawa |
| 11,970,076 B2 | 4/2024 | Sarfert et al. |
| 11,977,404 B2 | 5/2024 | Chandrasekaran |
| 11,984,802 B2 | 5/2024 | Merkin et al. |
| 11,984,876 B2 | 5/2024 | Neidorff et al. |
| 11,990,776 B2 | 5/2024 | Dulle |
| 11,990,777 B2 | 5/2024 | Woll et al. |
| 11,996,686 B2 | 5/2024 | Chan et al. |
| 11,996,699 B2 | 5/2024 | Vasconcelos Araujo et al. |
| 11,996,714 B2 | 5/2024 | El Markhi et al. |
| 11,996,715 B2 | 5/2024 | Nandi et al. |
| 11,996,762 B2 | 5/2024 | Hembach et al. |
| 11,996,830 B2 | 5/2024 | Murthy et al. |
| 11,996,847 B1 | 5/2024 | Kazama et al. |
| 12,003,191 B2 | 6/2024 | Chaudhary et al. |
| 12,003,229 B2 | 6/2024 | Kaya et al. |
| 12,003,237 B2 | 6/2024 | Waters |
| 12,008,847 B2 | 6/2024 | Braun et al. |
| 12,009,679 B2 | 6/2024 | Gottwald et al. |
| 12,012,057 B2 | 6/2024 | Schneider et al. |
| 12,015,342 B2 | 6/2024 | Kienzler et al. |
| 12,019,112 B2 | 6/2024 | Jarmolowitz et al. |
| 12,021,517 B2 | 6/2024 | S et al. |
| 2009/0161301 A1 | 6/2009 | Woody et al. |
| 2010/0302733 A1 | 12/2010 | Woody et al. |
| 2011/0171887 A1 | 7/2011 | Tanimoto et al. |
| 2017/0331469 A1 | 11/2017 | Kilb et al. |
| 2018/0368262 A1* | 12/2018 | Motohashi ............ H02K 11/33 |
| 2019/0276071 A1* | 9/2019 | Nagashima ............ H02P 25/22 |
| 2020/0195121 A1 | 6/2020 | Keskar et al. |
| 2020/0274375 A1* | 8/2020 | Griffiths .................. H02J 7/24 |
| 2021/0005711 A1 | 1/2021 | Martinez-Limia et al. |
| 2022/0052610 A1 | 2/2022 | Plum |
| 2022/0294441 A1 | 9/2022 | Purcarea et al. |
| 2023/0010616 A1 | 1/2023 | Gschwantner et al. |
| 2023/0061922 A1 | 3/2023 | Ritter |
| 2023/0082076 A1 | 3/2023 | Strache et al. |
| 2023/0126070 A1 | 4/2023 | Oberdieck et al. |
| 2023/0179198 A1 | 6/2023 | Winkler |
| 2023/0231210 A1 | 7/2023 | Joos et al. |
| 2023/0231400 A1 | 7/2023 | Oberdieck et al. |
| 2023/0231496 A1 | 7/2023 | Syed et al. |
| 2023/0238808 A1 | 7/2023 | Swoboda et al. |
| 2023/0268826 A1 | 8/2023 | Yan et al. |
| 2023/0335509 A1 | 10/2023 | Poddar |
| 2023/0365086 A1 | 11/2023 | Schumacher et al. |
| 2023/0370062 A1 | 11/2023 | Wolf |
| 2023/0378022 A1 | 11/2023 | Kim et al. |
| 2023/0386963 A1 | 11/2023 | Kim et al. |
| 2023/0402930 A1 | 12/2023 | Corry et al. |
| 2023/0420968 A1 | 12/2023 | Oner et al. |
| 2023/0421049 A1 | 12/2023 | Neidorff |
| 2024/0006869 A1 | 1/2024 | Kim et al. |
| 2024/0006899 A1 | 1/2024 | Wernerus |
| 2024/0006993 A1 | 1/2024 | Barjati et al. |
| 2024/0022187 A1 | 1/2024 | Fassnacht |
| 2024/0022240 A1 | 1/2024 | Balaz |
| 2024/0022244 A1 | 1/2024 | S et al. |
| 2024/0030730 A1 | 1/2024 | Wernerus |
| 2024/0039062 A1 | 2/2024 | Wernerus |
| 2024/0039402 A1 | 2/2024 | Bafna et al. |
| 2024/0039406 A1 | 2/2024 | Chen et al. |
| 2024/0048048 A1 | 2/2024 | Zhang |
| 2024/0055488 A1 | 2/2024 | Lee et al. |
| 2024/0067116 A1 | 2/2024 | Qiu |
| 2024/0072675 A1 | 2/2024 | Formenti et al. |
| 2024/0072817 A1 | 2/2024 | K et al. |
| 2024/0077899 A1 | 3/2024 | Chitnis et al. |
| 2024/0078204 A1 | 3/2024 | Roehrle et al. |
| 2024/0079950 A1 | 3/2024 | Narayanasamy |
| 2024/0079958 A1 | 3/2024 | Kumar et al. |
| 2024/0080028 A1 | 3/2024 | Dake et al. |
| 2024/0088647 A1 | 3/2024 | Ramadass et al. |
| 2024/0088896 A1 | 3/2024 | Bilhan et al. |
| 2024/0097437 A1 | 3/2024 | Goyal et al. |
| 2024/0097459 A1 | 3/2024 | Swoboda et al. |
| 2024/0105276 A1 | 3/2024 | Duryea |
| 2024/0106248 A1 | 3/2024 | Woll et al. |
| 2024/0106435 A1 | 3/2024 | Zhang et al. |
| 2024/0113517 A1 | 4/2024 | Sriraj et al. |
| 2024/0113611 A1 | 4/2024 | Kaufmann et al. |
| 2024/0113620 A1 | 4/2024 | Ranmuthu et al. |
| 2024/0113624 A1 | 4/2024 | Southard et al. |
| 2024/0120558 A1 | 4/2024 | Zhang et al. |
| 2024/0120765 A1 | 4/2024 | Oner et al. |
| 2024/0120962 A1 | 4/2024 | Miriyala et al. |
| 2024/0128851 A1 | 4/2024 | Ruck et al. |
| 2024/0128859 A1 | 4/2024 | Chen |
| 2024/0128867 A1 | 4/2024 | Wang et al. |
| 2024/0146177 A1 | 5/2024 | Mehdi et al. |
| 2024/0146306 A1 | 5/2024 | Ramkaj et al. |
| 2024/0149734 A1 | 5/2024 | Eisenlauer |
| 2024/0162723 A1 | 5/2024 | Zipf et al. |
| 2024/0178756 A1 | 5/2024 | El-Markhi et al. |
| 2024/0178824 A1 | 5/2024 | Kazama et al. |
| 2024/0186803 A1 | 6/2024 | Krieg et al. |
| 2024/0198937 A1 | 6/2024 | Benqassmi et al. |
| 2024/0198938 A1 | 6/2024 | Carlos et al. |
| 2024/0204540 A1 | 6/2024 | Majmunovic et al. |
| 2024/0204541 A1 | 6/2024 | Majmunovic et al. |
| 2024/0204671 A1 | 6/2024 | Liu et al. |
| 2024/0204765 A1 | 6/2024 | Dake |
| 2024/0213874 A1 | 6/2024 | Junnarkar et al. |

(56) References Cited

U.S. PATENT DOCUMENTS

| | | |
|---|---|---|
| 2024/0213971 A1 | 6/2024 | Lee |
| 2024/0213975 A1 | 6/2024 | Narayanasamy |
| 2024/0213981 A1 | 6/2024 | Agarwal et al. |

FOREIGN PATENT DOCUMENTS

| | | |
|---|---|---|
| JP | 2005259962 A | 9/2005 |
| JP | 2009193990 A | 8/2009 |
| JP | 2020205335 A | 12/2020 |
| JP | 6954413 B1 | 10/2021 |
| WO | 2007093598 A1 | 8/2007 |
| WO | 2019034505 A1 | 2/2019 |
| WO | 2020156820 A1 | 8/2020 |
| WO | 2020239797 A1 | 12/2020 |
| WO | 2021110405 A1 | 6/2021 |
| WO | 2021213728 A1 | 10/2021 |
| WO | 2022012943 A1 | 1/2022 |
| WO | 2022229149 A1 | 11/2022 |
| WO | 2023006491 A1 | 2/2023 |
| WO | 2023046607 A1 | 3/2023 |
| WO | 2023094053 A1 | 6/2023 |
| WO | 2023110991 A1 | 6/2023 |
| WO | 2023147907 A1 | 8/2023 |
| WO | 2023151850 A1 | 8/2023 |
| WO | 2023227278 A1 | 11/2023 |
| WO | 2023237248 A1 | 12/2023 |
| WO | 2024006181 A2 | 1/2024 |
| WO | 2024012743 A1 | 1/2024 |
| WO | 2024012744 A1 | 1/2024 |
| WO | 2024022219 A1 | 2/2024 |
| WO | 2024041776 A1 | 2/2024 |
| WO | 2024046614 A1 | 3/2024 |
| WO | 2024049730 A1 | 3/2024 |
| WO | 2024049884 A1 | 3/2024 |
| WO | 2024049909 A1 | 3/2024 |
| WO | 2024056388 A1 | 3/2024 |
| WO | 2024068065 A1 | 4/2024 |
| WO | 2024068076 A1 | 4/2024 |
| WO | 2024068113 A1 | 4/2024 |
| WO | 2024068115 A1 | 4/2024 |
| WO | 2024083391 A1 | 4/2024 |
| WO | 2024093384 A1 | 5/2024 |
| WO | 2024104970 A1 | 5/2024 |
| WO | 2024108401 A1 | 5/2024 |
| WO | 2024110106 A1 | 5/2024 |
| WO | 2024110265 A1 | 5/2024 |
| WO | 2024110297 A1 | 5/2024 |
| WO | 2024114978 A1 | 6/2024 |
| WO | 2024114979 A1 | 6/2024 |
| WO | 2024114980 A1 | 6/2024 |
| WO | 2024128286 A1 | 6/2024 |
| WO | 2024132249 A1 | 6/2024 |

OTHER PUBLICATIONS

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. Grc-E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/IEEE/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&ref_url=https%253A%252F%252Fwww.google.com%252F.

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

\* cited by examiner

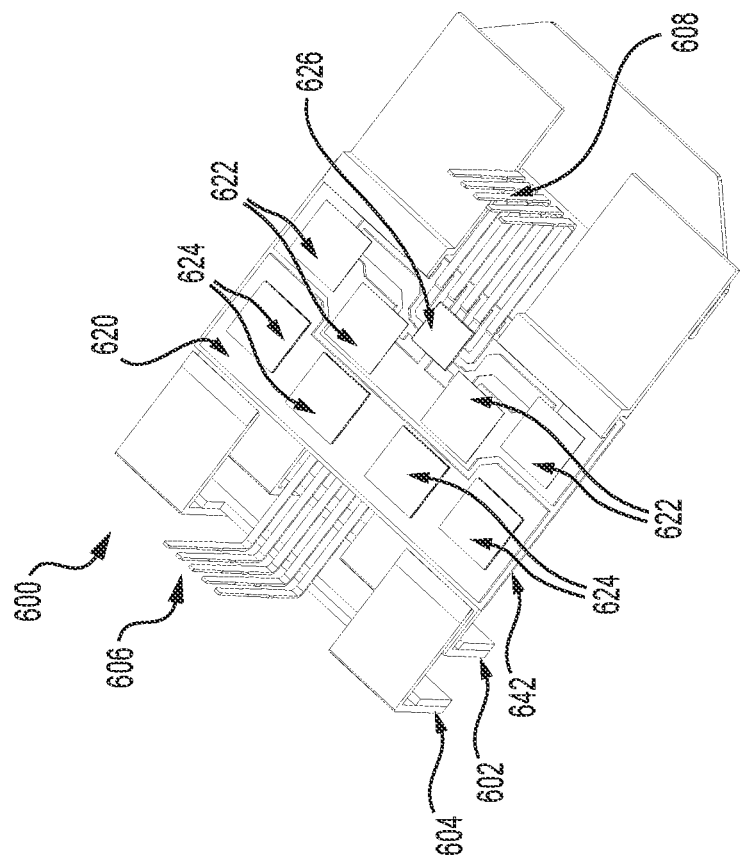
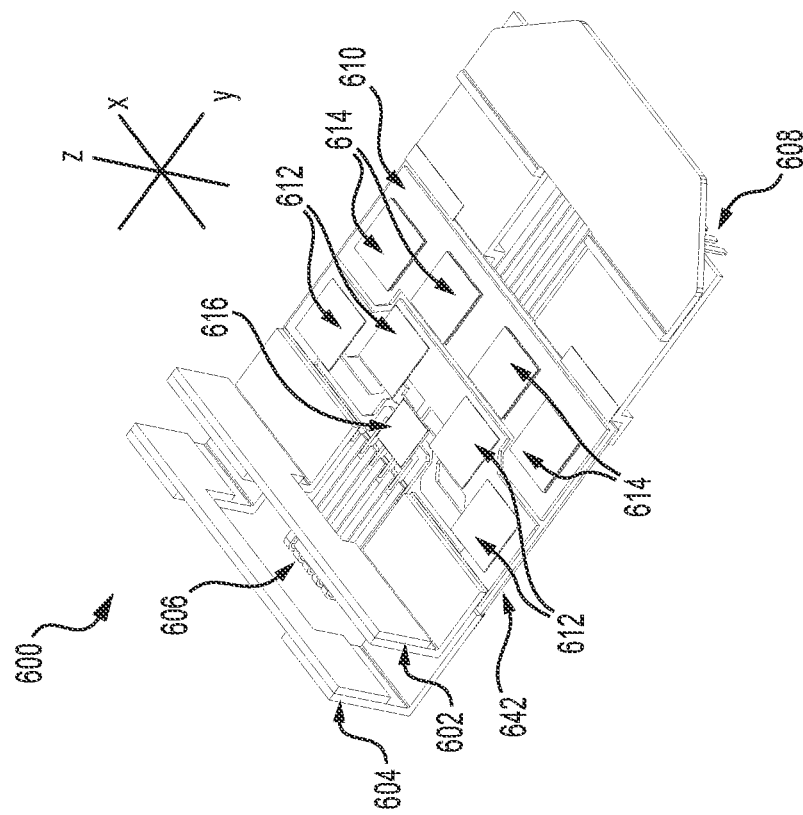
FIG. 7A
FIG. 7B

SYSTEMS AND METHODS FOR LOW INDUCTANCE PHASE SWITCH FOR INVERTER FOR ELECTRIC VEHICLE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377,501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to systems and methods for a low inductance phase switch for an inverter for an electric vehicle, and, more particularly, to systems and methods for a power module including two low inductance phase switches for an inverter for an electric vehicle.

BACKGROUND

Inverters, such as those used to drive a motor in an electric vehicle, for example, are responsible for converting High Voltage Direct Current (HVDC) into Alternating Current (AC) to drive the motor. In an inverter, loop inductance associated with a phase switch may affect switching losses of the switch.

The present disclosure is directed to overcoming one or more of these above-referenced challenges.

SUMMARY OF THE DISCLOSURE

In some aspects, the techniques described herein relate to a system including: an inverter configured to convert DC power from a battery to AC power to drive a motor, wherein the inverter includes: a power module including: a first phase switch including one or more first phase power switches on a first side of a substrate; and a second phase switch including one or more second phase power switches on a second side of the substrate opposite to the first side.

In some aspects, the techniques described herein relate to a system, wherein the first phase switch includes a first point-of-use controller on the first side of the substrate, the first point-of-use controller configured to control the one or more first phase power switches; and wherein the second phase switch includes a second point-of-use controller on the second side of the substrate, the second point-of-use controller configured to control the one or more second phase power switches.

In some aspects, the techniques described herein relate to a system, wherein the first phase switch includes one or more first thermal spacers on the first side of the substrate; and wherein the second phase switch includes one or more second thermal spacers on the second side of the substrate.

In some aspects, the techniques described herein relate to a system, wherein the one or more first thermal spacers are approximately aligned with the second phase power switches, and the one or more second thermal spacers are approximately aligned with the first phase power switches.

In some aspects, the techniques described herein relate to a system, wherein the first phase switch is configured to be connected between a negative terminal of a battery and a phase terminal of the motor, and wherein the second phase switch is configured to be connected between a positive terminal of the battery and the phase terminal of the motor.

In some aspects, the techniques described herein relate to a system, wherein the one or more of the first phase power switches or the second phase power switches includes one or more silicon carbide dies.

In some aspects, the techniques described herein relate to a system, wherein the first phase switch and the second phase switch are arranged in a 180-degree orientation relative to each other.

In some aspects, the techniques described herein relate to a system, further including: the battery configured to supply the DC power to the inverter; and the motor configured to receive the AC power from the inverter to drive the motor.

In some aspects, the techniques described herein relate to a system including: a power module for an inverter, the power module including: a first phase switch including one or more first phase power switches on a first side of a substrate; and a second phase power switch including one or more second phase power switches on a second side of the substrate opposite to the first side.

In some aspects, the techniques described herein relate to a system, wherein the first phase switch includes a first point-of-use controller on the first side of the substrate, the first point-of-use controller configured to control the one or more first phase power switches; and wherein the second phase switch includes a second point-of-use controller on the second side of the substrate, the second point-of-use controller configured to control the one or more second phase power switches.

In some aspects, the techniques described herein relate to a system, wherein the first phase switch includes one or more first thermal spacers on the first side of the substrate; and wherein the second phase switch includes one or more second thermal spacers on the second side of the substrate.

In some aspects, the techniques described herein relate to a system, wherein the one or more first thermal spacers are approximately aligned with the second phase power switches, and the one or more second thermal spacers are approximately aligned with the first phase power switches.

In some aspects, the techniques described herein relate to a system, wherein the first phase switch is configured to be connected between a negative terminal of a battery and a phase terminal of a motor, and wherein the second phase switch is configured to be connected between a positive terminal of the battery and the phase terminal of the motor.

In some aspects, the techniques described herein relate to a system, wherein the first phase switch and the second phase switch are arranged in a 180-degree orientation relative to each other.

In some aspects, the techniques described herein relate to a system including: a power module for an inverter, the power module including: a battery side negative tab; a battery side positive tab; a motor side tab; a first phase switch extending along a first plane, the first phase switch configured to control a flow of current between the battery side negative tab and the motor side tab; and a second phase power switch extending along a second plane, the second phase power switch configured to control a flow of current between the battery side positive tab and the motor side tab, wherein the first phase switch is stacked on the second phase power switch so that a normal vector from the first plane intersects the second plane.

In some aspects, the techniques described herein relate to a system, wherein one or more of the battery side negative tab or battery side positive tab extends in a first direction approximately perpendicular to the first plane and the second plane.

In some aspects, the techniques described herein relate to a system, wherein the first phase switch includes one or more communication pins, and wherein the one or more communication pins extends in a second direction opposite to the first direction.

In some aspects, the techniques described herein relate to a system, wherein the battery side negative tab is arranged on a first end of the first phase switch, wherein the battery side positive tab is arranged on a first end of the second phase switch, and wherein the motor side tab is arranged on a second end of the first phase switch and a second end of the second phase switch.

In some aspects, the techniques described herein relate to a system, wherein the first phase switch includes one or more communication pins, and wherein the one or more communication pins extend from the first phase switch and pass through an opening in the battery side positive tab.

In some aspects, the techniques described herein relate to a system, further including: a first heat sink provided on a first side of the power module; and a second heat sink provided on a second side of the power module.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

FIG. 7A and FIG. 7B depict top and bottom views of an exemplary layout for a power module including two low inductance phase switches, according to one or more embodiments.

DETAILED DESCRIPTION OF EMBODIMENTS

Figure 1:
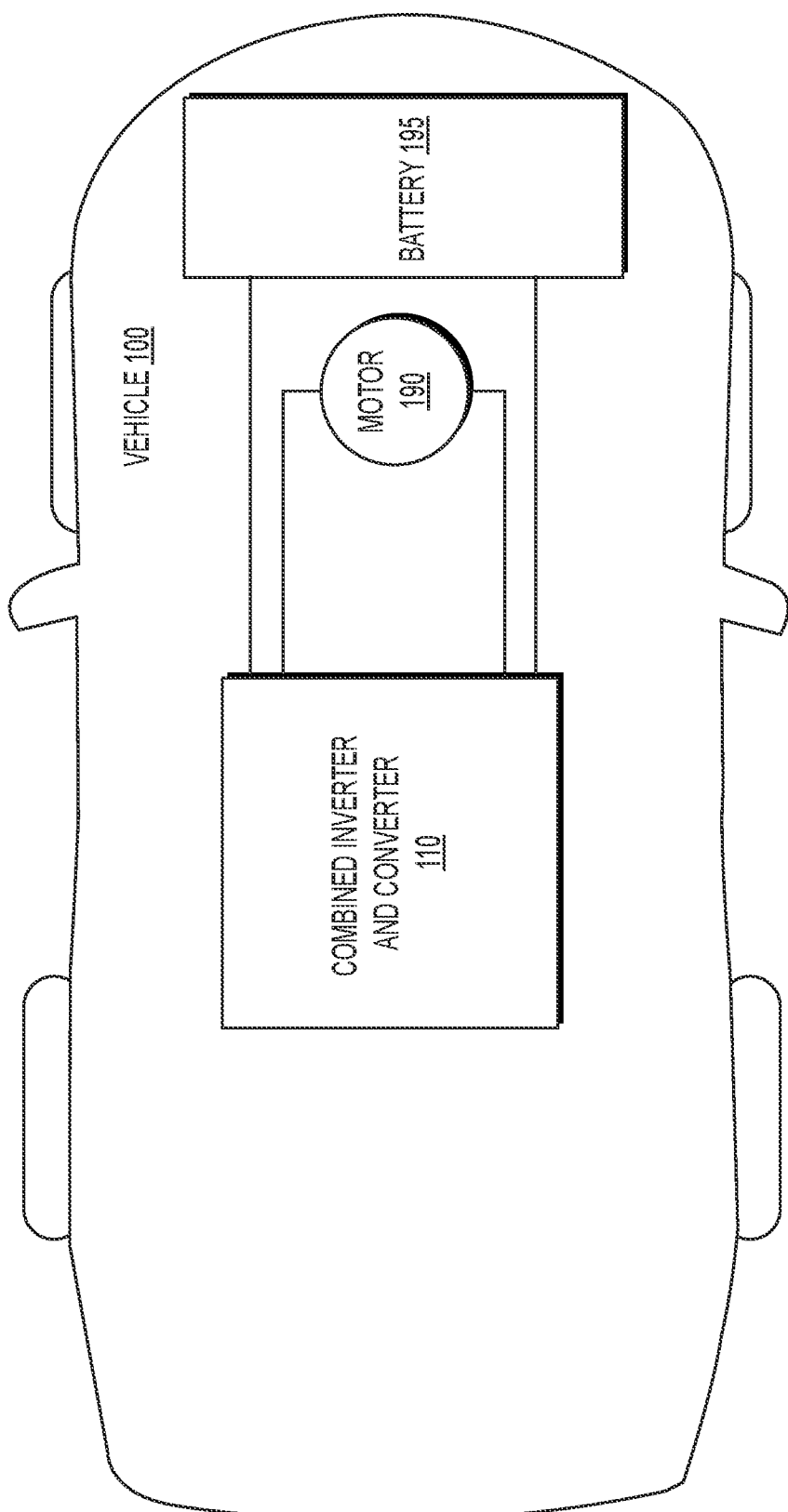
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to systems and methods for a low inductance phase switch for an inverter for an electric vehicle, and, more particularly, to systems and methods for a power module including two low inductance phase switches for an inverter for an electric vehicle.

Inverters, such as those used to drive a motor in an electric vehicle, for example, are responsible for converting High Voltage Direct Current (HVDC) into Alternating Current (AC) to drive the motor. A three phase inverter may include a bridge with six power device switches (for example, power transistors such as IGBT or MOSFET) that are controlled by Pulse Width Modulation (PWM) signals generated by a controller. An inverter may include three phase switches to control the phase voltage, upper and lower gate drivers to control the switches, a PWM controller, and glue logic between the PWM controller and the gate drivers. The PWM controller may generate signals to define the intended states of the system. The gate drivers may send the signals from the PWM controller to the phase switches. The phase switches may drive the phase voltage. The inverter may include an isolation barrier between low voltage and high voltage planes. Signals may pass from the PWM controller to the phase switches by passing across the isolation barrier, which may employ optical, transformer-based, or capacitance-based isolation. PWM signals may be distorted when passing through the glue logic, which may include resistive, capacitive, or other types of filtering. PWM signals may be distorted when passing through the gate driver, due to the galvanic isolation barrier and other delays within the gate driver. PWM signals may be distorted when the signals processed by the phase switch via the gate driver output.

Gate drivers may tolerate common-mode transients that occur during field-effect transistor (FET) switching and when one side of the floating high voltage terminal is shorted to ground or subject to an electro-static discharge. These voltage transients may result in fast edges, which may create bursts of common-mode current through the galvanic isolation. A gate driver may need to demonstrate common-mode transient immunity (CMTI) in order to be effective and safe.

Gate drivers may have a high-voltage domain in common to the voltage plane of an associated FET. Further, high-voltage planes may be supplied by a flyback converter that may be isolated through a transformer from the low-voltage plane. The high-voltage domain supply may be used to power circuits which source and sink gate current to drive the FET and which may detect FET faults so the faults can be acted upon and/or communicated to the low-voltage domain. Gate drivers may include a galvanic channel dedicated to FET commands, and one or more bidirectional or unidirectional galvanic channels dedicated to FET communications.

High current switching transients may create strong electro-magnetic (EM) fields that may couple into nearby metal traces. The magnitude and frequency of coupled currents may depend upon the layout of the FET packaging solution and the direction and length of metal traces between the FET and the control integrated circuit (IC). For example, typical values for coupled currents may be up to 1 A at AC frequencies up to 100 MHz. Typically, within a circuit, the gate driver IC may be placed far enough away from the FET that high EM fields do not couple directly into the internal metal traces within the gate driver IC. The gate driver is placed a distance from EM fields such that induced currents within the circuitry are below levels that will cause malfunction of the gate driver, or a metal shield is placed between the gate driver and the source of EM fields to protect the gate driver circuitry. The output terminals of the gate driver that connect to the FET are exposed to the EM fields at the point where the output terminals are no longer covered by a shield. The gate driver switches large currents (such as 5 A to 15 A, for example) through these exposed terminals. The switched large currents are generally greater in magnitude than the EM-induced currents. The gate driver is able to overdrive the induced currents to maintain control of the FETs. The high side of the gate drivers and the FET may share a common ground and a gate control signal trace, both of which may be susceptible to coupled currents.

Gate drivers may turn on low-resistance switches to source and sink gate currents. Series resistors may sometimes be added to limit gate current. Switched gate currents may be larger than coupled currents in order to maintain control of their respective FETs.

Gate drivers may be able to sense FET operating voltages or currents in order to provide feedback and react to faults. Over-current faults may typically be detected by sensing the FET drain to source voltage and comparing the sensed voltage to a reference value. Sensed voltages may be heavily filtered to reject coupled currents. Filtering may slow down the response to fault conditions, resulting in delays in response. For example, the rate of current increase due to a low resistance short circuit may reach damaging levels prior to being detected by the heavily filtered drain to source voltage detection strategy. The resulting short circuit may damage the FET or the vehicle, prior to being detected and shut off.

According to one or more embodiments, a FET driver circuit may provide rapid over-current detection by either shunt current sensing or by diverting a fraction of the load current through a parallel FET that may have a current sensing circuit. Utilizing either strategy may require a "point-of-use IC" where sensing circuitry is in close proximity to the FET. Even if a point-of-use IC and a remote controller are resistant to EM fields, communication between the point-of-use IC and remote controller remains susceptible to induced currents. Point-of-use ICs have been implemented in low EM field applications, such as smart FETs for automotive applications. However, point-of-use ICs have not been used in high EM field applications. A high EM field may be a field (i) that induces a current within an IC that is in excess of an operating current of the IC and leads to malfunction, or (ii) that induces a differential voltage within an IC which is in excess of the operating differential voltage and leads to malfunction. A high EM field may be a field that is greater than approximately 10 A or approximately 100V, for example.

With the advent of electric vehicles, driving three phase motors more efficiently is becoming increasingly important. Three phase motors may be driven with three half-H or phase switches that switch the motor phase connections between a positive high voltage direct current voltage source (HVDC+) and a negative high voltage direct current voltage source (HVDC−). The loop inductance associated with the phase switches is important, and may be even more important as silicon carbide (SiC) devices become more prevalent. Lower loop inductance may be especially important with fast SiC devices as lower loop inductance may allow faster switching times while maintaining appropriate voltage along with appropriate current overshoots and ringing.

Phase switches may be made of two individual power switches in separate packages (e.g. two power modules) or two individual power switches in a single integrated package (e.g. a single power module). In a single sided cooling system, the power switches may be mounted side-by-side in order for each power switch to have a good thermal path to the heat sink of the cooling system. This side-by-side arrangement may limit a reduction of the loop area that creates the loop inductance. In a two-sided cooling system, the power switches may be mounted side-by-side in order to maximize the effectiveness of the dual heatsinks of the cooling system. This side-by-side arrangement may also limit a reduction of the loop area that creates the loop inductance. As higher cost SiC devices are used along with increased switching frequencies, switching losses may become a significant portion of the overall losses of the power module.

One or more embodiments may provide three ceramic substrates with symmetrical low side and high side power switches in the same package. The low side and high side power switches may be stacked one on top of the other in a 180-degree orientation. One or more embodiments may provide a thermal path for each power switch that is better that the single sided cooling system.

One or more embodiments may provide a thermal path for each power switch that may be less effective than the two-sided cooling system, but with a reduced loop inductance. One or more embodiments may provide a wide arrangement of SiC devices that results in minimal source and drain self-inductance per power switch. The low side and high side devices being stacked with currents flowing in opposing directions may create a mutual inductance between the two switches that effectively reduces the loop area and loop inductance. One or more embodiments may provide reduced source and drain inductance and symmetry between individual SiC dies, including gate connections, which may provide exceptionally clean switching waveforms. One or more embodiments may include an integrated gate driver that provides an optimum gate drive profile for the power switches. The integrated gate driver may be application-specific integrated circuit (ASIC). The integrated gate driver may include multiple outputs for groups of SiC dies on each of the power switches. One or more embodiments may provide reduced loop inductance, which may allow lower switching losses of SiC dies, which may increase electric vehicle range for a given battery size. One or more embodiments may provide a thermal performance between that of a single sided cooling system and a two-sided cooling system, but with higher switching speed and frequencies. One or more embodiments may provide a layout and device symmetry that may result in excellent waveform characteristics.

FIG. 1 depicts an exemplary system infrastructure for a vehicle including a combined inverter and converter, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
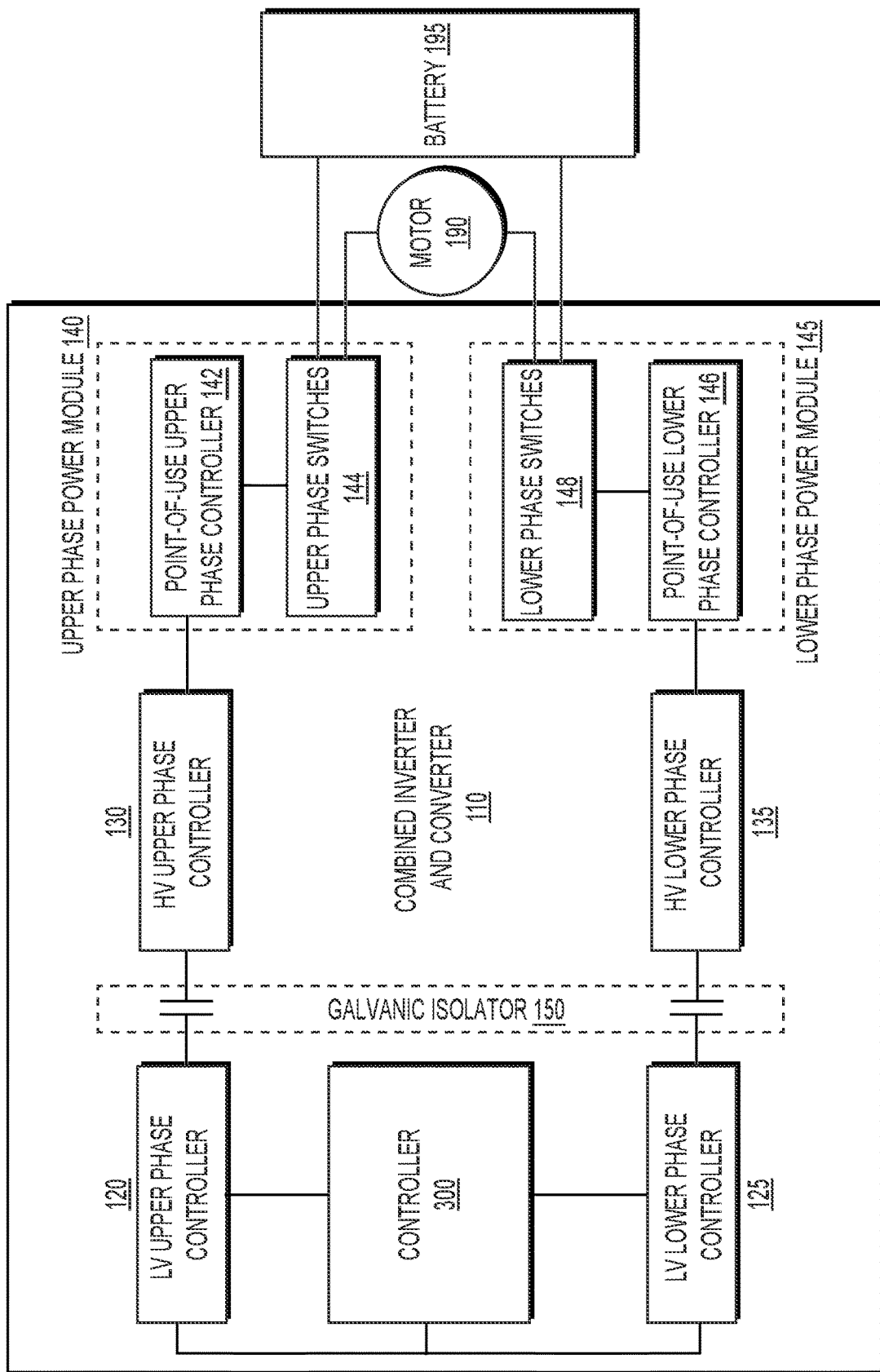
FIG. 2 depicts an exemplary system infrastructure for the combined inverter and converter of FIG. 1 with a point-of-use switch controller, according to one or more embodiments.

FIG. 2 depicts an exemplary system infrastructure for the inverter 110 of FIG. 1 with a point-of-use switch controller, according to one or more embodiments. Electric vehicle 100 may include inverter 110, motor 190, and battery 195. Inverter 110 may include an inverter controller 300 (shown in FIG. 3) to control the inverter 110. Inverter 110 may include a low voltage upper phase controller 120 separated from a high voltage upper phase controller 130 by a galvanic isolator 150, and an upper phase power module 140. Upper phase power module 140 may include a point-of-use upper phase controller 142 and upper phase switches 144. Inverter 110 may include a low voltage lower phase controller 125 separated from a high voltage lower phase controller 135 by galvanic isolator 150, and a lower phase power module 145. Lower phase power module 145 may include a point-of-use lower phase controller 146 and lower phase switches 148. Upper phase switches 144 and lower phase switches 148 may be connected to motor 190 and battery 195. Galvanic isolator 150 may be one or more of optical, transformer-based, or capacitance-based isolation. Galvanic isolator 150 may be one or more capacitors with a value from approximately 20 fF to approximately 100 fF, with a breakdown voltage from approximately 6 kV to approximately 12 kV, for example. Galvanic isolator 150 may include a pair of capacitors, where one capacitor of the pair carries an inverse data signal from the other capacitor of the pair to create a differential signal for common-mode noise rejection. Galvanic isolator 150 may include more than one capacitor in series. Galvanic isolator 150 may include one capacitor located on a first IC, or may include a first capacitor located on a first IC and a second capacitor located on a second IC that communicates with the first IC.

Inverter 110 may include a low voltage area, where voltages are generally less than 5V, for example, and a high voltage area, where voltages may exceed 500V, for example. The low voltage area may be separated from the high voltage area by galvanic isolator 150. Inverter controller 300 may be in the low voltage area of inverter 110, and may send signals to and receive signals from low voltage upper phase controller 120. Low voltage upper phase controller 120 may be in the low voltage area of inverter 110, and may send signals to and receive signals from high voltage upper phase controller 130. Low voltage upper phase controller 120 may send signals to and receive signals from low voltage lower phase controller 125. High voltage upper phase controller 130 may be in the high voltage area of inverter 110. Accordingly, signals between low voltage upper phase controller 120 and high voltage upper phase controller 130 pass through galvanic isolator 150. High voltage upper phase controller 130 may send signals to and receive signals from point-of-use upper phase controller 142 in upper phase power module 140. Point-of-use upper phase controller 142 may send signals to and receive signals from upper phase switches 144. Upper phase switches 144 may be connected to motor 190 and battery 195. Upper phase switches 144 and lower phase switches 148 may be used to transfer energy from motor 190 to battery 195, from battery 195 to motor 190, from an external source to battery 195, or from battery 195 to an external source, for example. The lower phase system of inverter 110 may be similar to the upper phase system as described above.

Figure 3:
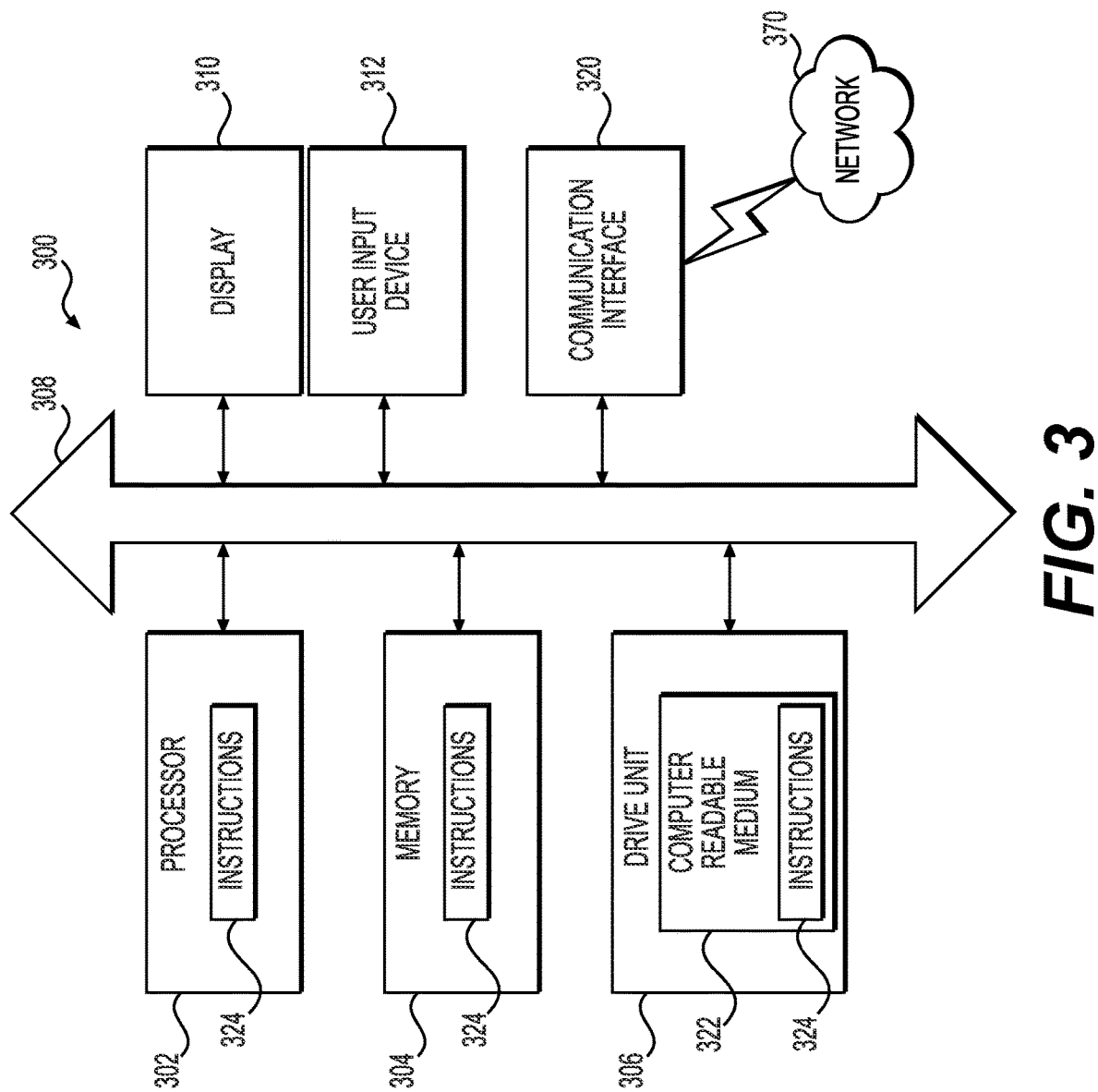
FIG. 3 depicts an exemplary system infrastructure for the controller of FIG. 2, according to one or more embodiments.

FIG. 3 depicts an exemplary system infrastructure for inverter controller 300 of FIG. 2, according to one or more embodiments. Inverter controller 300 may include one or more controllers.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
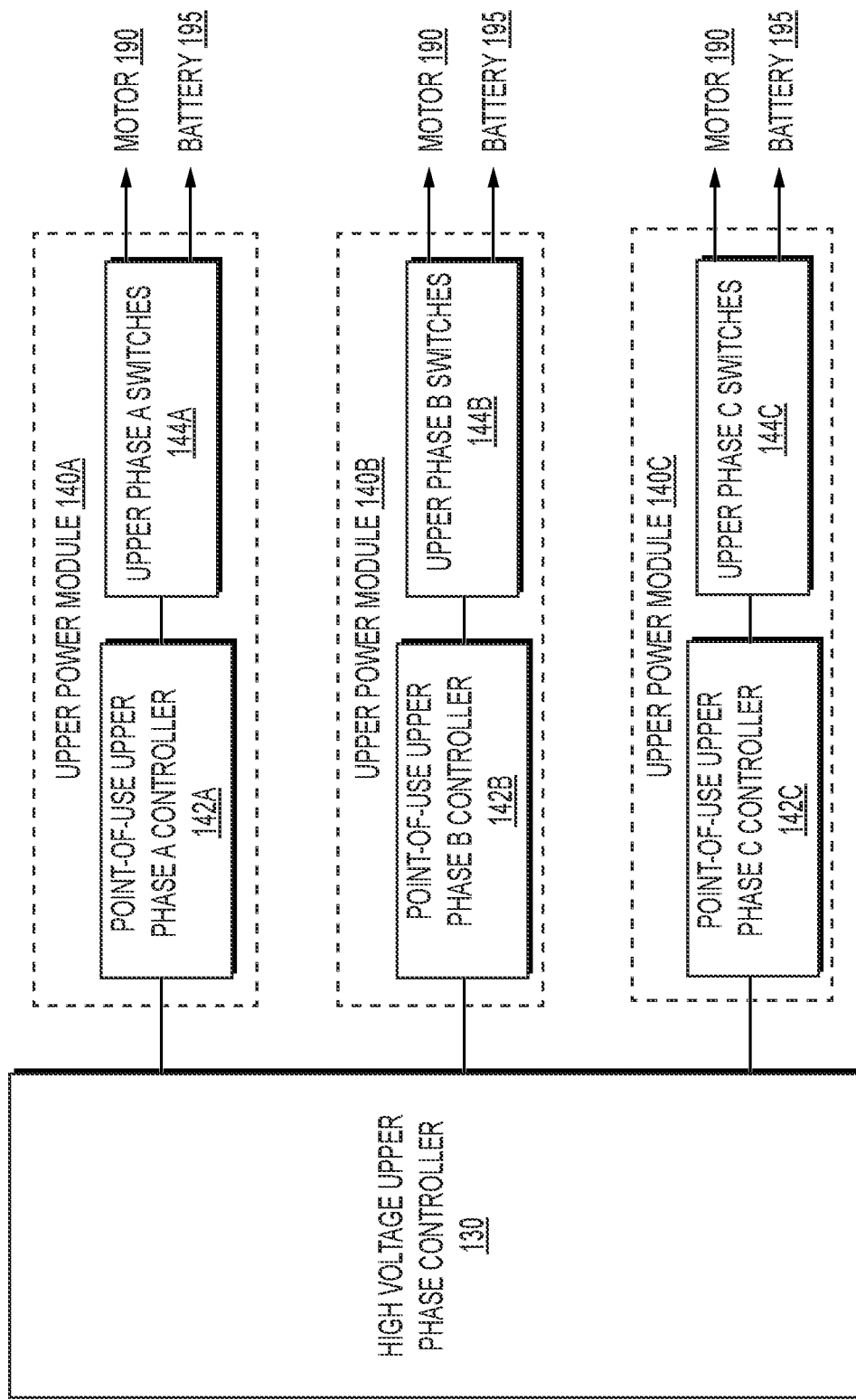
FIG. 4 depicts an exemplary system infrastructure for the point-of-use switch controller of FIG. 2, according to one or more embodiments.

FIG. 4 depicts an exemplary system infrastructure for the point-of-use switch controller of FIG. 2, according to one or more embodiments. For a three-phase inverter, each of the upper phase and the lower phase may include three phases correlating with phases A, B, and C. For example, upper phase power module 140 may include upper phase power module 140A for upper phase A, upper phase power module 140B for upper phase B, and upper phase power module 140C for upper phase C. Upper phase power module 140A may include point-of-use upper phase A controller 142A and upper phase A switches 144A. Upper phase power module 140B may include point-of-use upper phase B controller 142B and upper phase B switches 144B. Upper phase power module 140C may include point-of-use upper phase C controller 142C and upper phase C switches 144C. Each of the upper phase A switches 144A, upper phase B switches 144B, and upper phase C switches 144C may be connected to motor 190 and battery 195. FIG. 4 depicts details of the upper phase power module 140. Although not shown, the lower phase power module 145 may include a similar structure as the upper phase power module 140 for lower phases A, B, and C.

Figure 5:
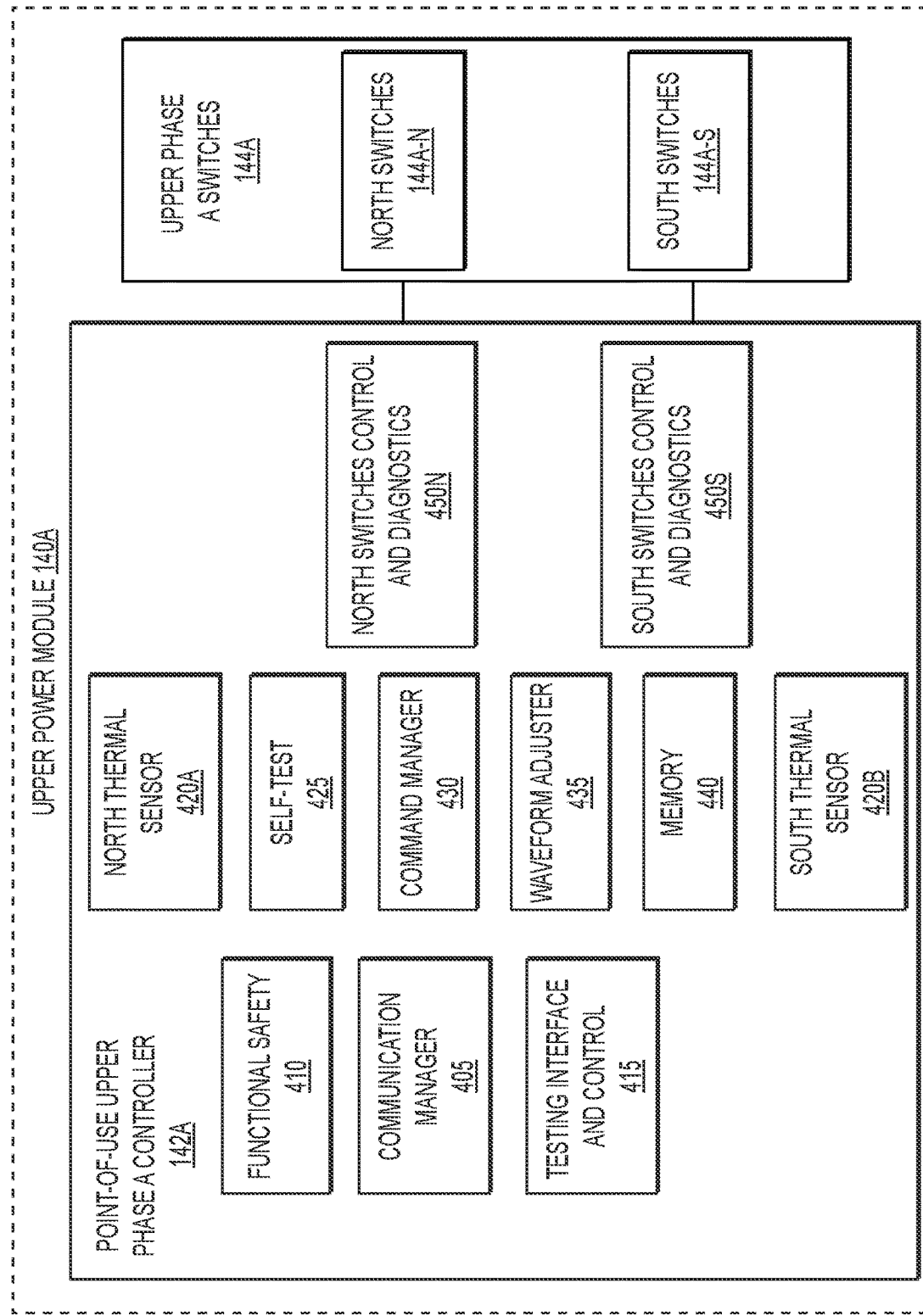
FIG. 5 depicts an exemplary system infrastructure for the upper power module of FIG. 4, according to one or more embodiments.

FIG. 5 depicts an exemplary system infrastructure for the upper power module of FIG. 4, according to one or more embodiments. For example, FIG. 5 provides additional details of upper phase power module 140A. Although not shown, upper phase power module 140B, upper phase power module 140C, and respective lower phase power modules of lower phase power module 145 may include a similar structure as the upper phase power module 140A shown in FIG. 5. Moreover, the terms upper, lower, north, and south used in the disclosure are merely for reference, do not limit the elements to a particular orientation, and are generally interchangeable throughout. For example, the upper phase power module 140 could be referred to a lower phase power module, a north phase power module, a south phase power module, a first phase power module, or a second phase power module.

Upper phase power module 140A may include point-of-use upper phase A controller 142A and upper phase A switches 144A. Upper phase A switches 144A may include one or more groups of switches. As shown in FIG. 5, upper phase A switches 144A may include upper phase A north switches 144A-N and upper phase A south switches 144A-S. Point-of-use upper phase A controller 142A may include one or more memories, controllers, or sensors. For example, point-of-use upper phase A controller 142A may include a communication manager 405, a functional safety controller 410, a testing interface and controller 415, a north thermal sensor 420A, a south thermal sensor 420B, a self-test controller 425, a command manager 430, a waveform adjuster 435, a memory 440, north switches control and diagnostics controller 450N, and south switches control and diagnostics controller 450S. Point-of-use upper phase A controller 142A may include more or less components than those shown in FIG. 5. For example, point-of-use upper phase A controller 142A may include more or less than two switch control and diagnostics controllers, and may include more than two thermal sensors.

Communication manager 405 may control inter-controller communications to and from point-of-use upper phase A controller 142A and/or may control intra-controller communications between components of point-of-use upper phase A controller 142A. Functional safety controller 410 may control safety functions of point-of-use upper phase A controller 142A. Testing interface and controller 415 may control testing functions of point-of-use upper phase A controller 142A, such as end-of-line testing in manufacturing, for example. North thermal sensor 420A may sense a temperature at a first location in point-of-use upper phase A controller 142A, and south thermal sensor 420B may sense a temperature at a second location in point-of-use upper phase A controller 142A. Self-test controller 425 may control a self-test function of point-of-use upper phase A controller 142A, such as during an initialization of the point-of-use upper phase A controller 142A following a power on event of inverter 110, for example. Command manager 430 may control commands received from communication manager 405 issued to the north switches control and diagnostics controller 450N and south switches control and diagnostics controller 450S. Waveform adjuster 435 may control a waveform timing and shape of commands received from communication manager 405 issued to the north switches control and diagnostics controller 450N and south switches control and diagnostics controller 450S. Memory 440 may include one or more volatile and nonvolatile storage media for operation of point-of-use upper phase A controller 142A. North switches control and diagnostics controller 450N may send one or more signals to north switches 144A-N to control an operation of north switches 144A-N, and may receive one or more signals from north switches 144A-N that provide information about north switches 144A-N. South switches control and diagnostics controller 450S may send one or more signals to south switches 144A-S to control an operation of south switches 144A-S, and may receive one or more signals from south switches 144A-S that provide information about south switches 144A-S. As stated above, the terms north and south are merely used for reference, and north switches control and diagnostics controller 450N may send one or more signals to south switches 144A-S, and south switches control and diagnostics controller 450S may send one or more signals to south switches 144A-N.

Figure 6:
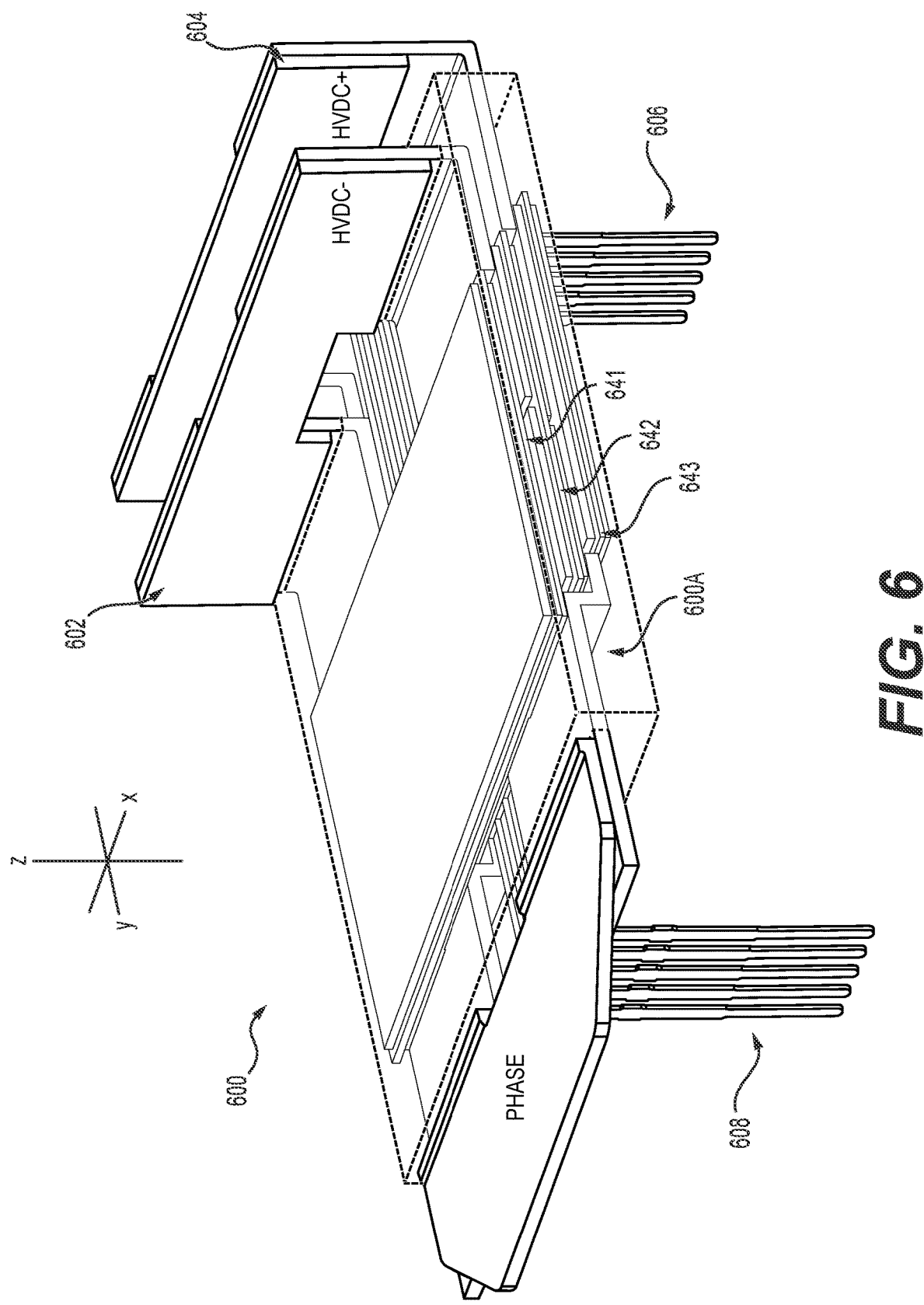
FIG. 6 depicts an exemplary system for a power module including two low inductance phase switches, according to one or more embodiments.

FIG. 6 depicts an exemplary system for a power module including two low inductance phase switches, according to one or more embodiments.

As shown in FIG. 6, power module 600 may include one or more phase switches, and may include first switch 602 and second switch 604. First switch 602 may be stacked on top of second switch 604. Power module 600 may include upper ceramic substrate 641, center ceramic substrate 642, and lower ceramic substrate 643. Here, the term "stacked" may refer to an arrangement of the first switch 602 extending along a first x-y plane and the second switch 604 extending along a second x-y plane, where a normal vector along the z-axis from the first plane intersects the second plane. As shown in FIG. 6, first switch 602 is stacked on second switch 604 along the z-axis, such that at least a portion of first switch 602 overlaps at least a portion of second switch 604 when viewed along the z-axis. Upper ceramic substrate 641 and lower ceramic substrate 643 may each include three layers, for example, including a ceramic substrate between two direct metallization layers, such as copper, for example. Center ceramic substrate 642 will be further described below.

First switch 602 may be a lower switch (with a source connected to HVDC−) and second switch 604 may be an upper switch (with a drain connected to HVDC+). For example, power module 600 may be an implementation of upper phase power module 140 and lower phase power module 145, where second switch 604 is an implementation of upper phase power module 140 and first switch 602 is an implementation of lower phase power module 145. As shown in FIG. 6, first switch 602 may include a battery side tab HVDC− and a motor side tab PHASE, and second switch 604 may include a battery side tab HVDC+ and share the motor side tab PHASE with first switch 602. Here, battery side tab HVDC− may be configured to be connected to a negative voltage terminal of battery 195, battery side tab HVDC+ may be configured to be connected to a positive voltage terminal of battery 195, and motor side tab PHASE may be configured to be connected to a phase terminal of motor 190.

One or more of the battery side tab HVDC− or the battery side tab HVDC+ may extend in approximately a perpendicular (z-axis) direction from the first (x-y) plane and the second (x-y) plane. A y-axis separation distance between the battery side tab HVDC− and battery side tab HVDC+ may be greater than a z-axis separation distance between the first x-y plane and the second x-y plane. For example, the y-axis separation distance may be approximately 5 mm.

Power module 600 may include first switch controller pins 606 to communicate with first switch controller 616 (see FIG. 7A), and second switch controller pins 608 to communicate with second switch controller 626 (see FIG. 7B). Power module 600 may include package material 600A to encapsulate electrical control components of first switch 602 and second switch 604, while providing connection points for battery side tab HVDC−, battery side tab HVDC+, motor side tab PHASE, first switch controller pins 606, and second switch controller pins 608. Package material 600A may be an epoxy molding compound, for example.

Figure 8:
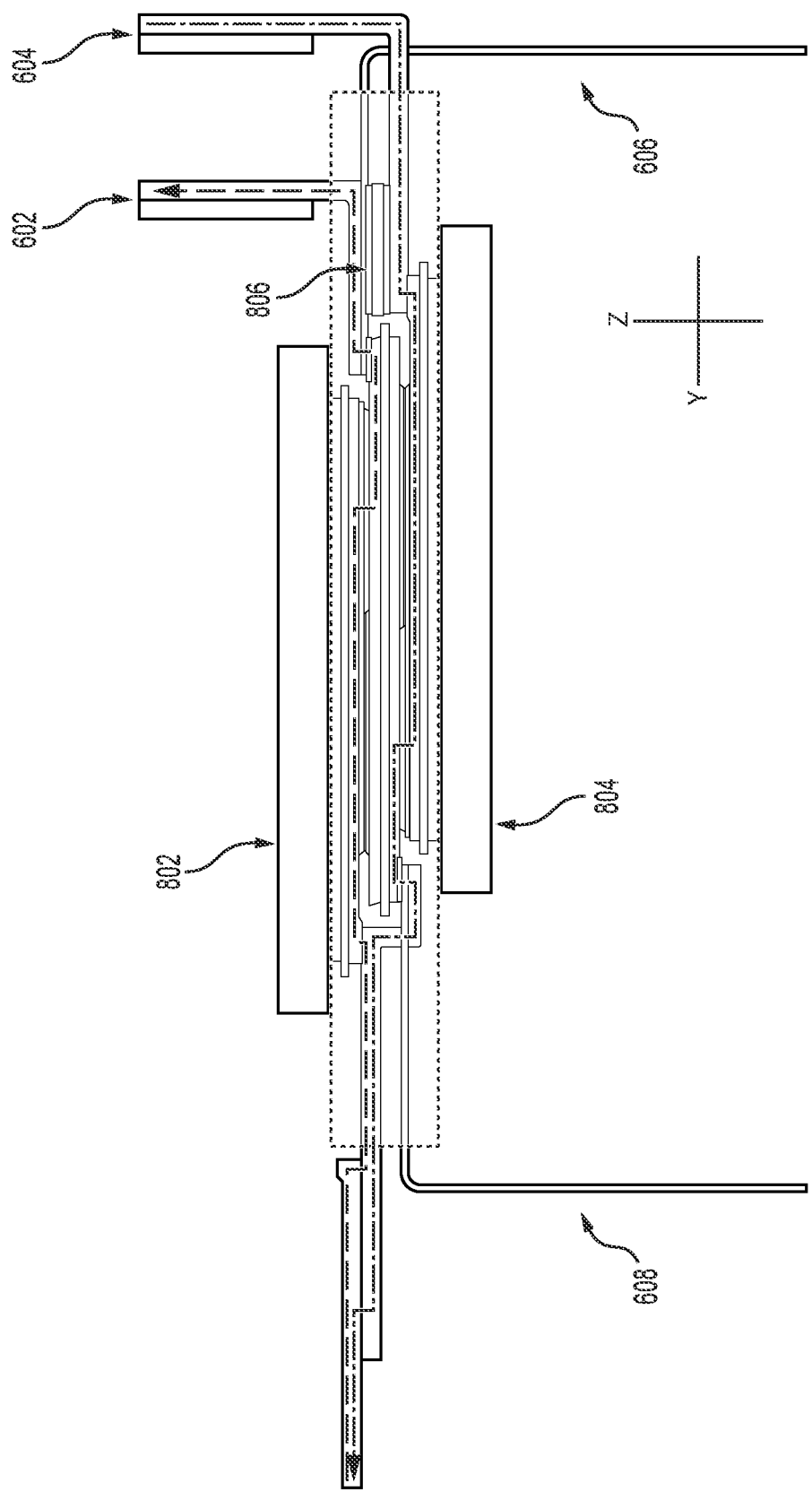
FIG. 8 depicts a side view of an exemplary layout for a power module including two low inductance phase switches, according to one or more embodiments.

As shown in FIGS. 6 and 7, electrical components of first switch 602 and second switch 604 may be arranged in opposite orientations along the y-axis, so that currents flow in opposite directions (see FIG. 8, where current flows generally left-to-right through first switch 602 and generally right-to-left through second switch 604, as indicated by the dashed lines in first switch 602 and second switch 604). Compared to a side-by-side arrangement, the stacked and opposite configuration of first switch 602 and second switch 604 may create a mutual inductance between the two switches 602 and 604 that effectively reduces the loop area and loop inductance. Furthermore, the stacked configuration may provide a thermal path for first switch 602 and second switch 604 to respective first heat sink 802 and second heat sink 804 (see FIG. 8 and FIG. 9).

The SiC source connections for both the first switch 602 and second switch 604 may be connected to respective metallization layers on center ceramic substrate 642. In FIG. 8, the first switch 602 is on top and the SiC source connections attach to the top metallization layer of the center ceramic substrate 642, and the second switch 604 SiC source connections attach to the bottom metallization layer of the center ceramic substrate 642. The SiC drain connections for the first switch 602 and second switch 604 may be connected to the bottom metallization layer of the upper ceramic substrate 641 and the top metallization layer of the lower ceramic substrate 643, respectively. This arrangement may be important for two reasons. First, the drains of the SiC dies have more surface area than the sources of the SiC die, and a thermal path of the drains to a heat sink may be reduced. For example, a source may have three pads and a gate connection, which reduces a thermal cross-section of the source. Second, sintering the drains of the SiC die to the metallization layers may be easier due to the larger geometries of the drain compared to the smaller source and gate pads. This arrangement may provide a better thermal path through the drain, with the cost of a non-optimum secondary thermal path through the source because the source heat has to flow through the center ceramic substrate 642 and spacers to the upper ceramic substrate 641 and the lower ceramic substrate 643.

Power module 600 may provide an acceptable level of thermal performance while meeting the need for higher switching speed and frequencies. The thermal performance may be better than a single sided cooled module with the switches arranged side by side, and may be reduced relative to a dual sided cooled module with switches arranged side by side. The reduced loop inductance of the stacked arrangement may allow for higher switching speeds, which may reduce switching losses and allow operation at higher switching frequencies for a given allowable switching loss. The stacked arrangement may also incur a smaller footprint than a side by side arrangement.

FIG. 7A and FIG. 7B depict respective top and bottom views of an exemplary layout for a power module 600 including two low inductance switches, according to one or more embodiments. FIGS. 7A and 7B depict the center ceramic substrate 642 and associated components, with the upper ceramic substrate 641 and the lower ceramic substrate 643 (see FIG. 6) removed.

As shown in FIG. 7A, controller pins 606 may pass through an opening in battery side tab HVDC− and battery side tab HVDC+ to reach first switch controller 616 provided on an upper side 610 of the center ceramic substrate 642. First switch controller 616 may use controller pins 606 to communicate with high voltage lower phase controller 135, for example. First switch controller 616 may be an implementation of point-of-use lower phase controller 146, for example, and may monitor and control first power switches 612. First power switches 612 may be an implementation of lower phase switches 148, for example. First switch 602 may include first switch thermal spacers 614. First switch thermal spacers 614 may be copper or copper-molybdenum, for example. First switch thermal spacers 614 may be configured to conduct heat from first switch 602 and second switch 604 to upper ceramic substrate 641.

As shown in FIG. 7B, controller pins 608 may pass through an opening in motor side tab PHASE to reach second switch controller 626 provided on a lower side 620 of the center ceramic substrate 642. Second switch controller 626 may use controller pins 608 to communicate with high voltage upper phase controller 130, for example. Second switch controller 626 may be an implementation of point-of-use upper phase controller 142, for example, and may monitor and control second power switches 622. Second power switches 622 may be an implementation of upper phase switches 144, for example. Second switch 604 may include second switch thermal spacers 624. Second switch thermal spacers 624 may be copper, for example. Second switch thermal spacers 624 may be configured to conduct heat from first switch 602 and second switch 604 to lower ceramic substrate 643.

First switch controller 616 and second switch controller 626 may each be an integrated point-of-use controller, and/or may each be an application-specific integrated circuit (ASIC), for example. One or more of first power switches 612 or second power switches 622 may include silicon carbide (SiC) dies, for example.

First switch controller 616 may receive a gate turn-on command via controller pins 606, for example. Based on the gate turn-on command, first switch controller 616 may turn on gates of first power switches 612. This, in turn, may turn on first switch 602 such that current flows between battery side tab HVDC− and motor side tab PHASE.

As shown in FIGS. 7A and 7B, first power switches 612 and second power switches 622 may each include four SiC dies. However, the disclosure is not limited thereto, and first power switches 612 and second power switches 622 may include more SiC dies or fewer SiC dies. The wide arrangement of the SiC dies of each of the first power switches 612 and second power switches 622 may provide reduced source and drain self-inductance per power switch. Here, a wide arrangement may refer to the SiC dies arranged in a more parallel fashion. This wide arrangement allows the source and drain metal to have less length, which may reduce inductance. With respect to current flow direction, the short length and wide width may provide lower inductance.

As shown in FIGS. 7A and 7B, the first power switches 612 are approximately aligned with the second switch thermal spacers 624 on the opposite side of the substrate, and the second power switches 622 are approximately aligned with the first switch thermal spacers 614 on the opposite side of the substrate. Here, approximately aligned may refer to similar x-y planar positions of respective components that are offset along the z-axis. This configuration may reduce loop inductance between the first switch 602 and second switch 604, and may provide an improved thermal path to first heat sink 802 and second heat sink 804.

First switch controller 616 and second switch controller 626 are arranged on opposite sides of power module 600 from each other, and each of the first switch controller 616 and second switch controller 626 is arranged nearer to respective first power switches 612 and second power switches 622 than to respective first switch thermal spacers 614 and second switch thermal spacers 624. In other words, the first switch 602 and second switch 604 are arranged in a 180-degree orientation relative to each other. This arrangement may allow for a reduction in the loop inductance between the first switch 602 and second switch 604, which may provide lower switching losses with optimal waveform characteristics.

FIG. 8 depicts a side view of an exemplary layout for a power module including two low inductance phase switches, according to one or more embodiments.

As shown in FIG. 8, power module 600 may include first heat sink 802 and second heat sink 804. First heat sink 802 and second heat sink 804 may be arranged on opposite sides of power module 600. First heat sink 802 may be arranged on first switch 602 and second heat sink 804 may be arranged on second switch 604. First heat sink 802 may be in direct contact with an outer surface of first switch 602 and second heat sink 804 may be in direct contact with an outer surface of second switch 604, or the heat sinks may be applied with a thermal interface material.

Power module 600 may include capacitor 806. Capacitor 806 may be provided between first switch 602 and second switch 604, such as between battery side tab HVDC− and battery side tab HVDC+. Capacitor 806 may be a high voltage integrated decoupling capacitor. Capacitor 806 may be electrically connected to battery side tab HVDC− and battery side tab HVDC+. Capacitor 806 may lower power loop and bus bar stray inductances. Capacitor 806 may provide faster switching times for first switch 602 and second switch 604, which may lower the switching power losses. Capacitor 806 may reduce the negative effect of bus bar stay inductance on safe switch response time, which may reduce switching time and switching power losses. Capacitor 806 may reduce high frequency ringing of voltages and currents of power module 600, which may provide faster switching and lower switching losses. Capacitor 806 may reduce an overall EMI pollution of power module 600.

Figure 9:
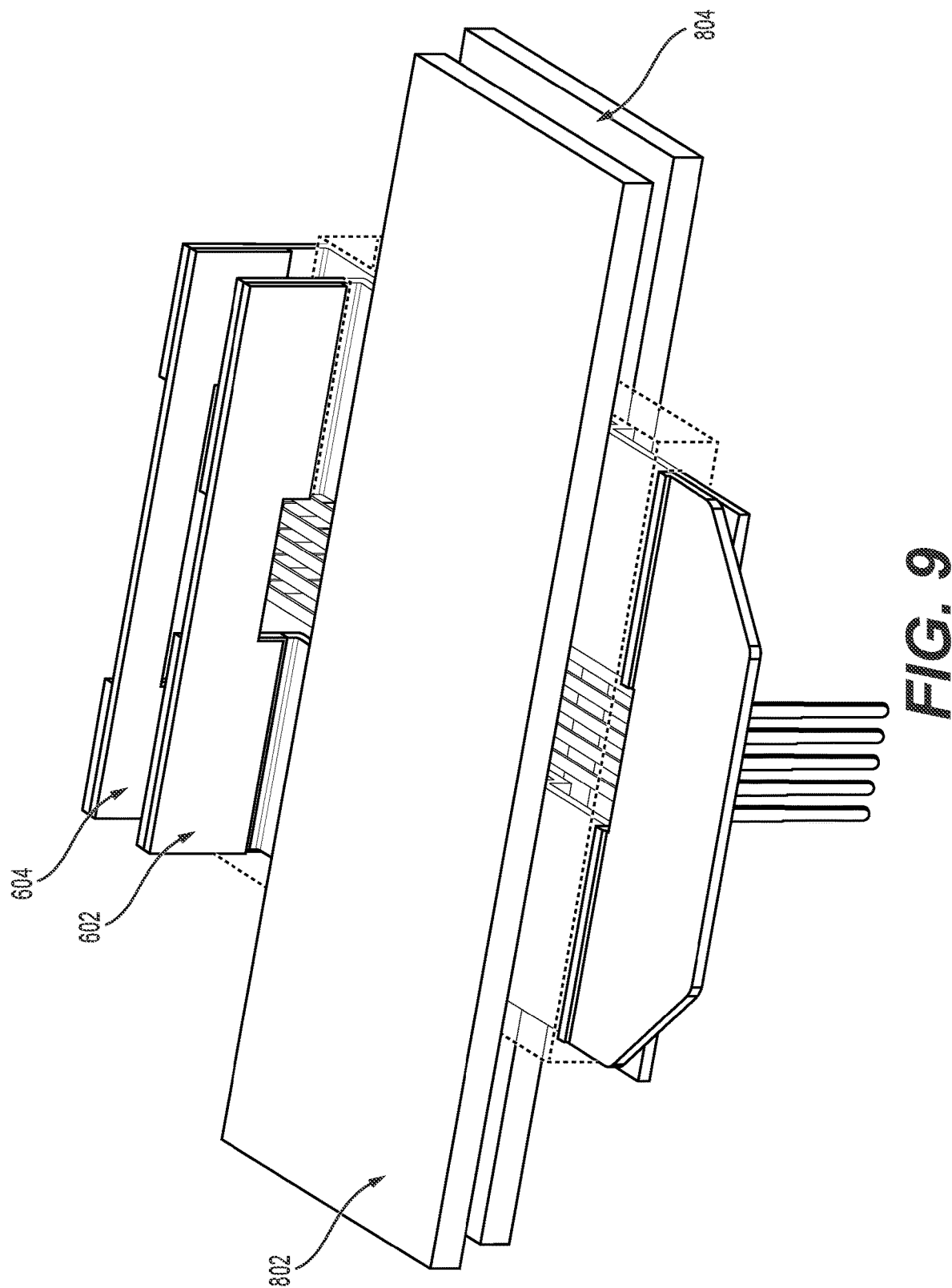
FIG. 9 depicts an exemplary system for a power module including two low inductance phase switches, according to one or more embodiments.

FIG. 9 depicts an exemplary system for a power module including two low inductance phase switches, according to one or more embodiments. FIG. 9 provides an isometric view of the power module 600 with first heat sink 802 and second heat sink 804 arranged on power module 600. The first heat sink 802 and second heat sink 804 may be configured to dissipate heat from power module 600. The first heat sink 802 and second heat sink 804 may be liquid cooled, and may be made of copper or aluminum, for example.

Figure 10:
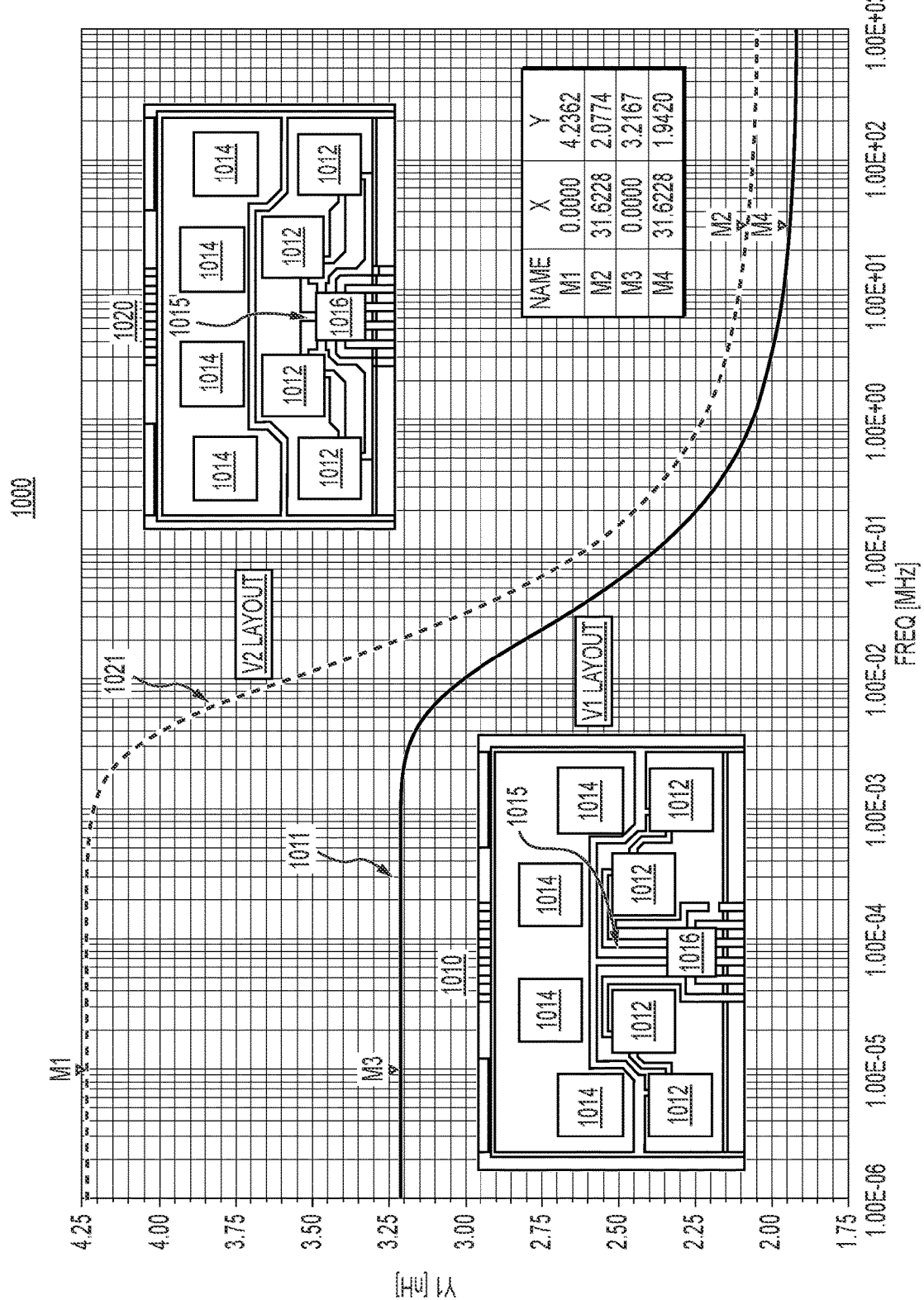
FIG. 10 depicts an exemplary inductance plot for two connection layouts for a system with a power module including two low inductance phase switches, according to one or more embodiments.

FIG. 10 depicts an exemplary inductance plot 1000 for two connection layouts for a system with a power module including two low inductance phase switches, according to one or more embodiments. FIG. 10 provides a diagrammatic view of two possible layouts for first switch 602 or second switch 604, for example, with a plot of inductance (y-axis) vs. frequency (x-axis) for each layout. In FIG. 10, power switches 1012, switch controller 1016, and thermal spacers 1014 may be implementations of power switches 612, switch controller 616, and thermal spacers 624, respectively.

The first layout 1010 may include a conductive pattern 1015 connecting the power switches 1012 with switch controller 1016, and separating the power switches 1012 from the thermal spacers 1014. In the first layout 1010, the inductance may be low across all frequencies, as shown in the plot 1011, where an inductance of the layout 1010 may have an upper value of approximately 3.2 nH at low frequencies, which may provide a reduction of two to five times the inductance of some designs. However, layout 1010 may have a lower current sensing capability than layout 1020. The SiC source metal current path in conductive pattern 1015 may have a lower resistance and lower inductance in 1015 than conductive pattern 1015'. The lower resistance in conductive pattern 1015 may provide less sensing voltage for a given current, which may provide a lower current sensing capability.

The second layout 1020 may include a conductive pattern 1015' connecting the power switches 1012 with switch controller 1016, and separating the power switches 1012 from the thermal spacers 1014. In the second layout 1020, the inductance may also be low across all frequencies, as shown in the plot 1021, where an inductance of the layout 1020 may have an upper value of approximately 4.2 nH at low frequencies. However, layout 1020 may have a higher current sensing capability than layout 1010, with a moderate increase in the inductance at any given frequency.

One or more embodiments may provide three ceramic substrates with symmetrical low side and high side power switches in the same package. The low side and high side power switches may be stacked one on top of the other in a 180-degree orientation. One or more embodiments may provide a thermal path for each power switch that is better that the single sided cooling system.

One or more embodiments may provide a thermal path for each power switch that may be less effective than the two-sided cooling system, but with a reduced loop inductance. One or more embodiments may provide a wide arrangement of SiC devices that results in minimal source and drain self-inductance per power switch. The low side and high side devices being stacked with currents flowing in opposing directions may create a mutual inductance between the two switches that effectively reduces the loop area and loop inductance. One or more embodiments may provide reduced source and drain inductance and symmetry between individual SiC dies, including gate connections, which may provide exceptionally clean switching waveforms. One or more embodiments may include an integrated gate driver that provides an optimum gate drive profile the power switches. The integrated gate driver may be application-specific integrated circuit (ASIC). The integrated gate driver may include multiple outputs for groups of SiC dies on each of the power switches. One or more embodiments may provide reduced loop inductance, which may allow lower switching losses with SiC dies, which may increase electric vehicle range for a given battery size. One or more embodiments may provide a thermal performance between that of a single sided cooling system and a two-sided cooling system, but with higher switching speed and frequencies. One or more embodiments may provide a layout and device symmetry that may result in excellent waveform characteristics.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:
an inverter configured to convert DC power from a battery to AC power to drive a motor, wherein the inverter includes:
a power module including:
a first phase switch including one or more first phase power switches on a first side of a substrate and one or more first thermal spacers on the first side of the substrate; and
a second phase switch including one or more second phase power switches on a second side of the substrate opposite to the first side and one or more second thermal spacers on the second side of the substrate;
wherein the one or more first thermal spacers are approximately aligned with the one or more second phase power switches, and the one or more second thermal spacers are approximately aligned with the one or more first phase power switches.

2. The system of claim 1,
wherein the first phase switch includes a first point-of-use controller on the first side of the substrate, the first point-of-use controller configured to control the one or more first phase power switches; and
wherein the second phase switch includes a second point-of-use controller on the second side of the substrate, the second point-of-use controller configured to control the one or more second phase power switches.

3. The system of claim 1,
wherein the first phase switch is configured to be connected between a negative terminal of the battery and a phase terminal of the motor, and
wherein the second phase switch is configured to be connected between a positive terminal of the battery and the phase terminal of the motor.

4. The system of claim 1, wherein the one or more of the first phase power switches or the second phase power switches includes one or more silicon carbide dies.

5. The system of claim 1, wherein the first phase switch and the second phase switch are arranged in a 180-degree orientation relative to each other.

6. The system of claim 1, further comprising:
the battery configured to supply the DC power to the inverter; and
the motor configured to receive the AC power from the inverter to drive the motor.

7. A system comprising:
a power module for an inverter, the power module including:
- a first phase switch including one or more first phase power switches on a first side of a substrate, wherein the first phase switch is configured to be connected between a negative terminal of a battery and a phase terminal of a motor; and
- a second phase switch including one or more second phase power switches on a second side of the substrate opposite to the first side, wherein the second phase switch is configured to be connected between a positive terminal of the battery and the phase terminal of the motor.

8. The system of claim 7,
wherein the first phase switch includes a first point-of-use controller on the first side of the substrate, the first point-of-use controller configured to control the one or more first phase power switches; and
wherein the second phase switch includes a second point-of-use controller on the second side of the substrate, the second point-of-use controller configured to control the one or more second phase power switches.

9. The system of claim 7,
wherein the first phase switch includes one or more first thermal spacers on the first side of the substrate; and
wherein the second phase switch includes one or more second thermal spacers on the second side of the substrate.

10. The system of claim 9, wherein the one or more first thermal spacers are approximately aligned with the one or more second phase power switches, and the one or more second thermal spacers are approximately aligned with the one or more first phase power switches.

11. The system of claim 7, wherein the first phase switch and the second phase switch are arranged in a 180-degree orientation relative to each other.

12. A system comprising:
a power module for an inverter, the power module including:
- a battery side negative tab;
- a battery side positive tab;
- a motor side tab;
- a first phase switch extending along a first plane, the first phase switch configured to control a flow of current between the battery side negative tab and the motor side tab; and
- a second phase switch extending along a second plane, the second phase switch configured to control a flow of current between the battery side positive tab and the motor side tab,
wherein the first phase switch is stacked on the second phase switch so that a normal vector from the first plane intersects the second plane.

13. The system of claim 12, wherein one or more of the battery side negative tab or battery side positive tab extends in a first direction approximately perpendicular to the first plane and the second plane.

14. The system of claim 13,
wherein the first phase switch includes one or more communication pins, and
wherein the one or more communication pins extends in a second direction opposite to the first direction.

15. The system of claim 12,
wherein the battery side negative tab is arranged on a first end of the first phase switch,
wherein the battery side positive tab is arranged on a first end of the second phase switch, and
wherein the motor side tab is arranged on a second end of the first phase switch and a second end of the second phase switch.

16. The system of claim 12,
wherein the first phase switch includes one or more communication pins, and
wherein the one or more communication pins extend from the first phase switch and pass through an opening in the battery side positive tab.

17. The system of claim 12, further comprising:
a first heat sink provided on a first side of the power module; and
a second heat sink provided on a second side of the power module.

* * * * *